(12) United States Patent
Fleury

(10) Patent No.: US 9,505,290 B2
(45) Date of Patent: Nov. 29, 2016

(54) METHOD AND DEVICE FOR DAYTIME MOTOR VEHICLE DRIVING ASSISTANCE

(71) Applicant: Valeo Vision, Bobigny (FR)

(72) Inventor: Benoist Fleury, Vincennes (FR)

(73) Assignee: Valeo Vision, Bobigny (FR)

( * ) Notice: Subject to any disclaimer, the term of this patent is extended or adjusted under 35 U.S.C. 154(b) by 259 days.

(21) Appl. No.: 14/385,676

(22) PCT Filed: Mar. 22, 2013

(86) PCT No.: PCT/EP2013/056041
§ 371 (c)(1),
(2) Date: Sep. 16, 2014

(87) PCT Pub. No.: WO2013/144002
PCT Pub. Date: Oct. 3, 2013

(65) Prior Publication Data
US 2015/0083897 A1    Mar. 26, 2015

(30) Foreign Application Priority Data
Mar. 26, 2012 (FR) ..................... 12 52674

(51) Int. Cl.
| | |
|---|---|
| *B60J 3/04* | (2006.01) |
| *G01J 1/42* | (2006.01) |
| *G02F 1/133* | (2006.01) |
| *B81B 7/00* | (2006.01) |

(52) U.S. Cl.
CPC ................. *B60J 3/04* (2013.01); *B81B 7/008* (2013.01); *G01J 1/4204* (2013.01); *G02F 1/13318* (2013.01); *Y02T 10/88* (2013.01)

(58) Field of Classification Search
CPC ..... B60J 3/04; G01J 1/4204; G02F 1/13318; Y02T 10/88
USPC ..................................... 250/214 AL
See application file for complete search history.

(56) References Cited

U.S. PATENT DOCUMENTS

| | | | |
|---|---|---|---|
| 3,961,181 A | 6/1976 | Golden | |
| 4,286,308 A | 8/1981 | Wolff | |
| 4,848,890 A | 7/1989 | Horn | |
| 5,258,607 A | 11/1993 | Agostini et al. | |
| 6,568,738 B1 * | 5/2003 | Braun | B60Q 3/0276 296/97.2 |
| 7,134,707 B2 * | 11/2006 | Isaac | B60J 3/04 296/97.2 |

FOREIGN PATENT DOCUMENTS

| | | |
|---|---|---|
| EP | 0498143 A1 | 8/1992 |
| WO | 9620846 A1 | 7/1996 |

* cited by examiner

*Primary Examiner* — Seung C Sohn
(74) *Attorney, Agent, or Firm* — Jacox, Meckstroth & Jenkins

(57) ABSTRACT

A method for assisting the daytime driving of a motor vehicle, including the steps of: placing at least one variable-transmission screen between the driver of the motor vehicle and the road scene in front of the vehicle, measuring, by means of at least one sensor, the brightness of the road scene in front of the vehicle, and processing the brightness measurement signal to convert it into a signal for controlling the coefficient of transmission of the variable-transmission screen. In one embodiment, the method includes the further step of transmitting the control signal by remote control waves to a receiver fitted to the variable-transmission screen for modulating the coefficient of transmission of the variable-transmission screen as a function of the brightness measured by the sensor.

20 Claims, 3 Drawing Sheets

METHOD AND DEVICE FOR DAYTIME MOTOR VEHICLE DRIVING ASSISTANCE

CROSS REFERENCE TO RELATED APPLICATIONS

Figure 1:
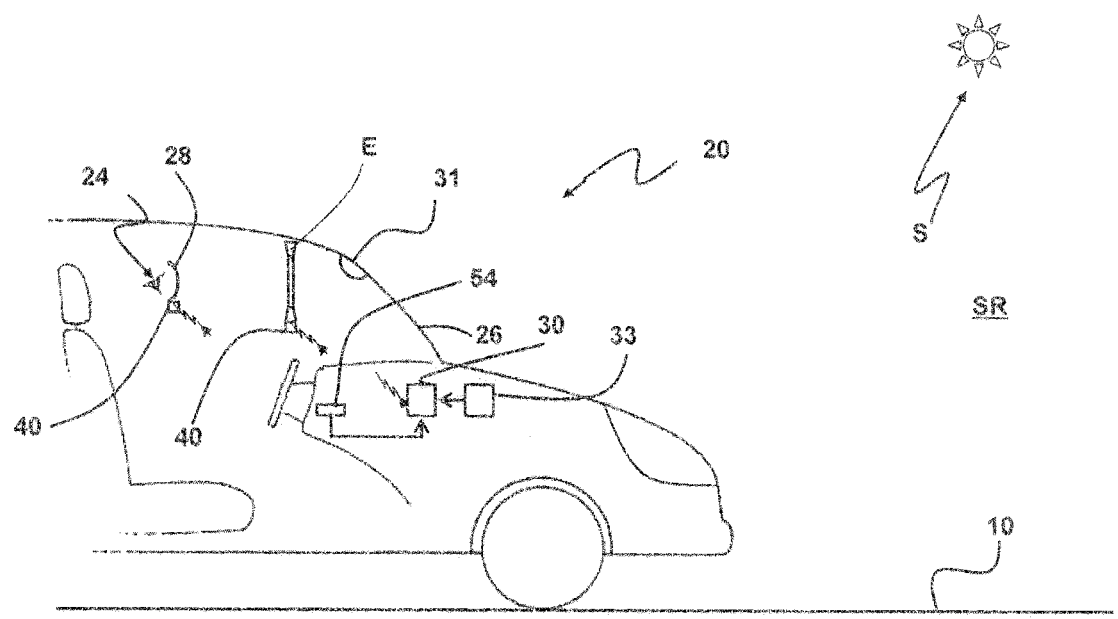

This application is the U.S. National Phase application of PCT/EP2013/056041 filed Mar. 22, 2013, which claims priority to French Application No. 1252674 filed Mar. 26, 2012, which applications are incorporated herein by reference and made a part hereof.

BACKGROUND OF THE INVENTION

1. Field of the Invention

The present invention relates to methods and devices intended to provide assistance to the driving of motor vehicles, particularly in daytime driving, when the external brightness is variable to a considerable degree, for example in sunny weather, when various events may alternatively illuminate the road scene strongly or darken it.

2. Description of the Related Art

Various solutions have been tested for the mitigation of this situation.

In a conventional solution, the driver wears sunglasses in order to avoid being dazzled by the sun and to distinguish the details of the road scene in front of the vehicle more clearly.

The drawback of these sunglasses is that the driver must remove them whenever the vehicle travels through a shaded area or a tunnel, or when the sun is obscured by dense clouds. This is because the attenuation provided by sunglasses, which is intrinsically constant, has the same effects in the absence of any inconvenience due to the sun, making it harder for the driver to perceive the details of the road scene.

An improvement of these conventional sunglasses has been the provision of photochromic glasses lenses which are sensitive to the ambient light level. These lenses have the property of changing color according to the amount of ultraviolet radiation to which they are subjected. The well-known drawback of these photochromic lenses is that they only return very gradually to their state of greater clarity in the absence of ultraviolet radiation, the time taken for the return to the clear state being much longer than the time taken for coloration.

A further drawback is that, since they only react to the presence of ultraviolet rays, their use for driving motor vehicles generally yields no benefit, as the windshields of most modern vehicles block the transmission of these ultraviolet rays. Photochromic lenses are therefore ineffective for preventing the dazzling of drivers of motor vehicles due to large variations of external brightness.

Other solutions, more complicated than simple sunglasses or photochromic sunglasses, have been proposed. For example, U.S. Pat. No. 3,961,181 discloses a screen for vehicle drivers, which protects both eyes separately but simultaneously from the effect of daytime dazzling due to sunlight and nighttime dazzling due to headlights of approaching vehicles. The screen includes a series of vertical, juxtaposed, contiguous cells which can be controlled electrically, for example liquid crystals, these cells being transparent in the absence of an applied voltage, and darkening as a function of the voltage applied. An array of photosensitive sensors whose electrical resistance increases with brightness is associated with the series of cells. Shields are placed in front of the sensors to create shadows on these sensors. Electrical control means are interposed between the sensors and the cells of the screen to control the transmission factor of the cells as a function of the signals received from the various sensors.

This structure is relatively difficult to create and adjust, the aim being to darken only those cells located between the source of dazzling and the driver's eyes.

Additionally, U.S. Pat. No. 4,848,890 discloses glasses whose lenses are formed by a matrix of liquid crystal cells, and whose frame is provided with a directional photosensitive sensor. Depending on the direction from which the solar rays arrive, cells are switched to an opaque state to prevent the wearer of the glasses from being dazzled by the sun. The major drawback of this arrangement relates to the fact that a large part of the glasses lenses, practically a quarter of the surface of each lens, is darkened, causing a reduction in the field of view that is incompatible with driving a motor vehicle.

EP 0 498 143 which is equivalent to U.S. Pat. No. 5,258,607, also discloses also discloses an active anti-dazzle screen for motor vehicle drivers. This screen, which is fixed to the windshield of the vehicle or may take the form of glasses lenses, includes an ambient brightness sensor, while a measurement circuit which also compares the measured value with a threshold value controls the state of transparency of the liquid crystals forming the glasses lenses. The lenses are totally transparent in the absence of a measurement signal. The drawback of this arrangement is that it operates in binary mode, in an on-off way, the lenses being in a state of maximum or minimum transparency depending on whether the brightness is below or above a predetermined threshold.

Additionally, U.S. Pat. No. 4,286,308 discloses an anti-dazzle device for nighttime driving, comprising a variable-transmission screen located in front of the driver, headlights capable of being switched rapidly from an illuminated state to an extinguished state, a sensor of the brightness of the road scene in front of the vehicle, and a control unit. When the exterior brightness level is below a predetermined limit, the variable-transmission screen is in its state of maximum transmission.

On the approach of vehicles traveling in the opposite direction, the control unit automatically controls the transmission/absorption ratio of the variable-transmission screen, in accordance with the brightness detected by the sensor, in order to increase the apparent density of the screen. If the exterior brightness exceeds a predetermined value, the duration of the periods for which the variable-transmission screen is opaque is at a maximum, so that the screen is transmissive only when the headlights are illuminated, thus providing maximum reduction of dazzling.

Document WO 9620846 discloses a method and a device for attenuating the light from the headlights of approaching vehicles, comprising the emission of light pulses by the vehicle headlights and the control of the transparency of filters in front of the driver's eyes in synchronization with the light pulses emitted by the headlights of the vehicle, the transparency of the filters being at a maximum for a duration exceeding that of the light pulses. In this way, the brightness of oncoming headlights is reduced.

The last two of these documents describe systems which are cumbersome and difficult to use, which are relatively slow in operation with relatively long response times, and in which the transparency of the filters or screens used is always less than 50%; that is to say these systems, using liquid crystals, cause a decrease in the perceived luminous intensity, even when their transmission is maximal.

What is needed, therefore, is a method and device that overcomes one or more of the problems in the prior art.

SUMMARY OF THE INVENTION

The present invention lies within this context and has the object of providing driving motor vehicle driving assistance, by providing the driver of the vehicle with a method for:
  attenuating the brightness of a strongly sunlit road scene, and preventing the dazzling of the driver and passengers, and
  providing a view of the road scene with an attenuation progressively decreasing as a function of the reduction of the brightness of the road scene, to a point of maximum transparency when the brightness of the road scene is low,
  the variation of the attenuation taking place automatically, without thereby impeding the driver's movements or restricting his field of view.

To this end, the present invention proposes a device for daytime motor vehicle driving assistance, including the steps of:
  placing at least one variable-transmission screen between the driver of the motor vehicle and the road scene in front of the vehicle,
  measuring, by means of at least one sensor, the brightness of the road scene in front of the vehicle,
  processing the brightness measurement signal to convert it into a signal for controlling the coefficient of transmission of the variable-transmission screen.

According to the invention, the method includes the further step of transmitting the control signal by remote control waves to a receiver fitted to the variable-transmission screen for modulating the coefficient of transmission of the variable-transmission screen as a function of the brightness measured by the sensor.

According to other characteristics of the invention, considered separately or in combination:
  the coefficient of transmission of the variable-transmission screen is modulated as a function of the brightness measured by the sensor, between a maximum value for a maximum transparency for a first duration and a minimum value for a minimum transparency for a second duration;
  the first duration with a maximum coefficient and the second duration with a minimum coefficient of transmission follow one another according to a pulse width modulation (PWM) cycle;
  the coefficient of transmission of the variable-transmission screen is a function of the measurement of the brightness of the road scene in front of the vehicle.

The invention also proposes a device for daytime motor vehicle driving assistance, including:
  a variable-transmission screen between the driver of the motor vehicle and the road scene in front of the vehicle,
  a sensor which measures the brightness of the road scene in front of the vehicle,
  a device for processing the brightness measurement signal to convert it into a signal for controlling the coefficient of transmission of the variable-transmission screen.

According to the invention, a control unit receives the control signal and transmits it by remote control waves to a receiver fitted to the variable-transmission screen in order to control the coefficient of transmission of the screen.

According to other characteristics of the invention, considered separately or in combination:
  the coefficient of transmission of the variable-transmission screen is modulated as a function of the brightness measured by the sensor, between a maximum value for a maximum transparency for a first duration and a minimum value for a minimum transparency for a second duration;
  the coefficient of transmission of the variable-transmission screen is modulated according to a pulse width modulation (PWM) cycle;
  the duty cycle of the pulse width modulation (PWM) cycle is a function of the measurement of the brightness of the road scene in front of the vehicle;
  the variable-transmission screen between the driver of the motor vehicle and the road scene in front of the vehicle is formed by:
    the windshield of the vehicle,
    a screen placed between the windshield of the vehicle and the driver of the vehicle, or
    glasses worn by the driver of the vehicle.
  the coefficient of transmission of the variable-transmission screen is controlled as a function of the measured brightness according to a wireless communication protocol;
  the coefficient of transmission of the variable-transmission screen is controlled by a control unit receiving the signals from a sensor for measuring the brightness of the road scene in front of the vehicle, and the signals from a sensor for measuring the amount of light transmitted by the variable-transmission screen;
  the duty cycle of the pulse width modulation (PWM) cycle is a function of the measurement of the brightness of the road scene in front of the vehicle.

The invention also proposes a variable-transmission screen adapted to be placed between the driver of a motor vehicle and the road scene in front of the vehicle.

According to the invention, the coefficient of transmission of the screen is variable according to a pulse width modulation (PWM) mode between a maximum value and a minimum value, the coefficient of transmission of the variable-transmission screen being controlled by a control unit according to a wireless communication protocol, by means of remote control waves transmitted by a transmitter of the control unit and received by a receiver.

BRIEF DESCRIPTION OF THE ACCOMPANYING DRAWINGS

Figure 2:
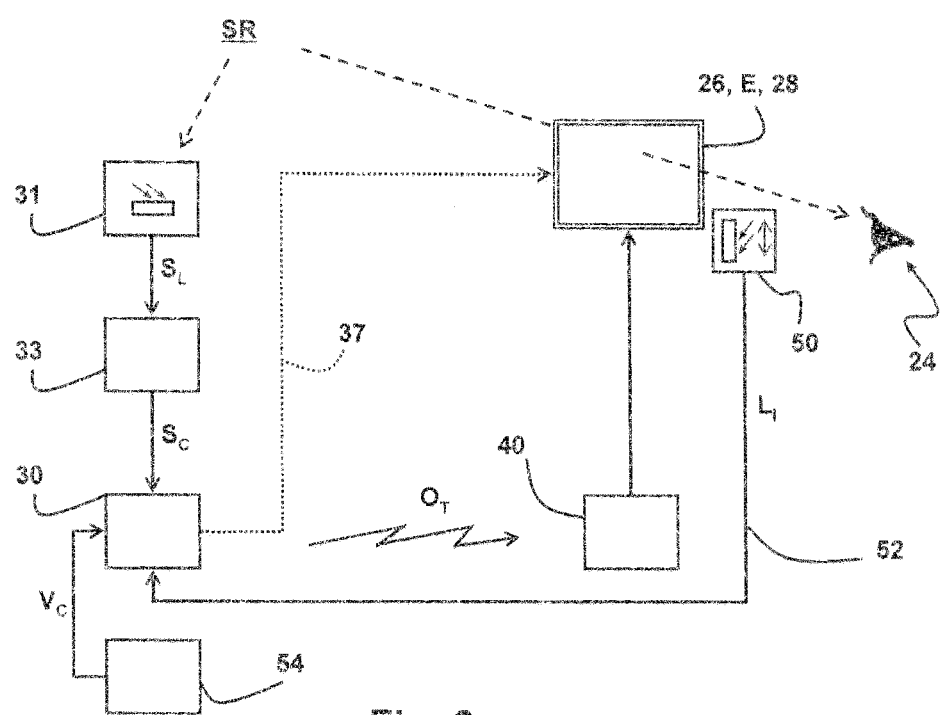
Figure 3A:
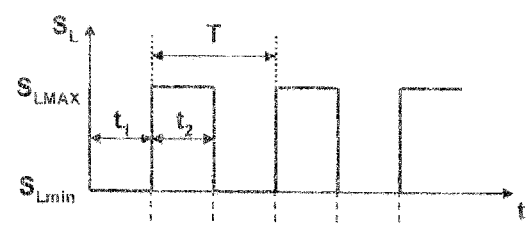
Figure 3B:
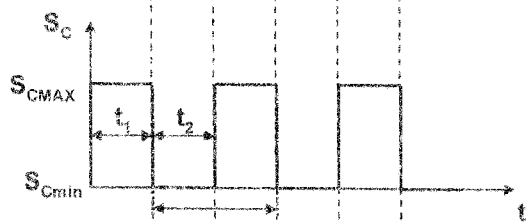
Figure 3C:
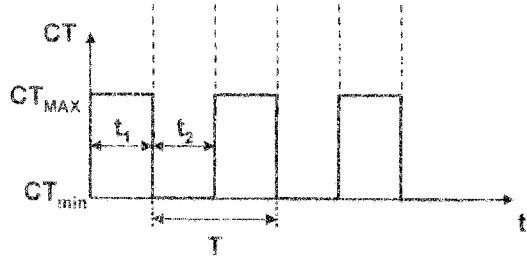

Other objects, characteristics and advantages of the present invention will be apparent from the following description of an exemplary embodiment, provided on a non-limiting basis with reference to the attached drawings, in which FIG. 1 shows schematically, in partial section, a vehicle fitted with a device according to the present invention;

FIG. 2 shows schematically a diagram of the operation of the device according to the present invention; and FIGS. 3A to 3C show diagrams of the temporal variation of the various signals used in the circuits of the present invention.

DETAILED DESCRIPTION OF THE PREFERRED EMBODIMENTS

FIG. 1 shows a partial section through a vehicle indicated as a whole by the reference 20, traveling on a road 10 and controlled by a driver 24, indicated symbolically by an eye.

As shown in this FIG. 1, in sunny weather, notably at the end of the day when the sun S is low on the horizon, the road scene SR in front of the vehicle 20 is strongly illuminated, and the driver 24 may not only be dazzled, but may also fail to distinguish details of this road scene SR that are important for his safety, for example traffic signs warning of the proximity of a hazard, or the state of the roadway on which he is traveling.

The invention therefore proposes to place between the driver 24 and the road scene SR a variable-transmission screen to modulate the amount of light reaching the driver's eye 24.

According to the embodiments of the invention, the variable-transmission screen may be formed by:
- a screen E properly so-called, which is placed between the driver 24 and the windshield 26, and which can be folded back like a sun visor,
- the windshield 26 itself, or
- a pair of glasses 28, worn by the driver 24 like sunglasses or corrective spectacles, only one glasses lens 28 being shown in FIG. 1.

These three embodiments have been shown simultaneously in FIG. 1 for ease of description. However, they are only variant embodiments of the invention, each of them tending to provide the same result.

In the rest of the description, the term "variable-transmission screen" will be used to denote any of:
- the screen E, regardless of whether it is fixed or of the foldable sun visor type;
- the windshield 26, or
- a pair of glasses 28.

The variable-transmission screen E is designed to have a very short response time and to allow a fast variation of its coefficient of transmission.

The liquid crystals make it possible to produce rapid reaction screens of this type. The same results can also be achieved by using other technologies, for example microelectromechanical systems, such as those of the type described in U.S. Pat. No. 7,684,105.

If the variable-transmission screen is fixed, as in the case of the windshield 26, it can be connected directly to the vehicle's 20 wiring harness to provide its power supply (by a link which is not shown).

If the variable-transmission screen is movable, as in the case of the screen E of the sun visor type or the pair of glasses 28, it may comprise its own independent power supply (not shown). In fact, the control of the state of transparency, or of the coefficient of transmission, of a liquid crystal screen or a microelectromechanical system requires only minimal electrical power, so that batteries such as button cells are sufficient to provide correct operation of the liquid crystal screen or of the microelectromechanical system for a considerable length of time, especially in the case of the glasses 28.

The term "microelectromechanical" is used in the present description to describe the concept known from the English acronym MEMS (standing for "MicroElectroMechanical System").

For controlling the coefficient of transmission of the variable-transmission screen E, the invention provides for the use of a photosensitive sensor 31 for measuring the brightness of the road scene SR in front of the vehicle 20.

Advantageously, the photosensitive sensor 31 is located on the inner face of the windshield 26, at the level of the interior rear view mirror (not shown), that is to say in the middle of the upper part of the windshield 26. This position makes it possible to collect information particularly representative of the brightness outside the vehicle 20, originating from the road scene SR. Also advantageously, the measurement signals of the photosensitive sensor 31 may also be used to cause the low beam headlights to be switched on when the brightness of the road scene SR falls below a predetermined threshold, as in most modern vehicles.

As is shown in greater detail in FIG. 2, the output signal $S_L$ of this photosensitive sensor 31 is received and processed by a circuit 33 adapted to convert this output signal $S_L$ into a signal $S_C$ for controlling the coefficient of transmission of the variable-transmission screen E, this signal $S_C$ in turn being received by a control unit 30 for controlling the coefficient of transmission of the variable-transmission screen E.

If the variable-transmission screen is fixed, as in the case of the windshield 26, the control unit 30 can be connected directly to it, for example by a wire link 37, as shown in dotted lines in FIG. 2.

If the variable-transmission screen is movable, as in the example of the screen E of the sun visor type or the pair of glasses 28, the control unit 30 may comprise a transmitter, for transmitting radio, infrared or ultrasonic waves for example, according to a wireless communication protocol, for example according to Bluetooth or Wi-Fi (registered trademarks) standards. These waves are referred to in the rest of the description as "remote control waves" OT. In this case, the variable-transmission screen E or the glasses 28 are provided with a receiver 40 of these remote control waves OT.

According to the present invention, the modulation of the coefficient of transmission of the variable-transmission screen E takes place in real time, as a function of the brightness of the road scene SR measured by the photosensitive sensor 31.

For this purpose, in response to the output signal $S_L$ of the photosensitive sensor 31, representing the brightness of the road scene SR in front of the vehicle 20, the circuit 33 generates a control signal $S_C$ which is a function of the signal $S_L$. The control signal $S_C$ is then transmitted, either directly by the control unit 30 and the wire link 37, or by the transmitter of the control unit 30, the waves OT and the receiver 40, to the variable-transmission screen E.

The coefficient of transmission of the variable-transmission screen E is thus modulated as a function of the received signal $S_C$, that is to say as a function of the brightness measured by the sensor 31, according to a well-known principle.

Thus, as the brightness measured by the sensor 31 increases, the signal $S_L$ becomes stronger and the coefficient of transmission of the variable-transmission screen E becomes smaller, or, in other words, the transmission by the variable-transmission screen E decreases.

Thus, according to the invention, a variable-transmission screen E has been provided, the coefficient of transmission of this screen E being adjusted in real time as a function of the brightness of the road scene SR observed by the driver 24: as the brightness increases, the variable-transmission screen E becomes darker, and vice versa.

The driver 24 of the vehicle 20 traveling in an environment in which the brightness is highly variable can thus observe the road scene SR in front of his vehicle 20 through the variable-transmission screen E described above, this screen E:
- attenuating the brightness of a strongly sunlit road scene SR, and preventing the dazzling of the driver 24,
- providing a view of the road scene SR with an attenuation progressively decreasing as a function of the reduction of the brightness of the road scene SR, to a point of maximum transparency when the brightness of the road scene SR is low, the variation of the attenuation taking place automatically.

In order to find the coefficient of transmission which exactly yields the desired darkening, a feedback loop may be included in the control of this coefficient, as shown in FIG. 2.

In this loop, an ocular sensor 50 measures the amount of light reflected by the cornea of the driver's eye 24. It is assumed that the light received by the driver's eye 24 has already passed through the variable-transmission screen E.

If the variable-transmission screen is formed by the windshield 26 or a screen E of the sun visor type, the sensor 50 may, for example, be formed by a miniature video camera, placed in the proximity of the sensor 31, and pointing toward the driver's 24 face. The processing of the image supplied by this sensor 50 enables the driver's eyes 24 to be isolated. Sensors of this type are already known and are used to detect any sleepiness in the driver 24 and to warn him. These sensors 50 may also measure the amount of light reflected by the cornea of the driver's eye 24, and may therefore deduce from this the amount of light transmitted by the variable-transmission screen E.

If the variable-transmission screen is formed by glasses 28 worn by the driver 24, the sensor 50 may be integrated into the frame of these glasses 28.

The measurement by the sensor 50 of the amount of light reflected by the cornea of the driver's eye 24 provides a measurement of the amount of light reaching this driver's eye 24, after preliminary calibration or graduation if necessary, and therefore provides an indirect measurement of the amount of light transmitted by the variable-transmission screen E.

This measurement $L_I$ of light transmitted by the variable-transmission screen E and striking the driver's eye 24 is transmitted by a link 52 to the control unit 30.

The link 52 may be a wire link if the variable-transmission screen is formed by the windshield 26 or by the movable screen E. If the variable-transmission screen is formed by glasses 28, the link 52 will advantageously be formed by a wireless link, for example by using radio, infrared or ultrasonic waves according to a wireless communication protocol.

Consequently the control unit 30 can simultaneously access:

the direct measurement of the brightness of the road scene SR, provided by the sensor 31, and the brightness of the road scene SR attenuated by the variable-transmission screen E, provided by the sensor 50.

The control unit 30 contains a comparator which compares the measured value $L_I$ of the light striking the driver's eye 24, after its passage through the variable-transmission screen E, with a set point value $V_C$, contained in a memory 54. As a function of the difference between the set point value $V_C$ and the measured value $L_I$, and as a function of the signal $S_C$, which is itself a function of the value of the brightness outside the vehicle, the control unit 30 constantly adjusts the control signal transmitted by the wire link 37 or by the waves $O_T$, so as to make the measured value $L_I$ equal to the set point value $V_C$.

This set point value $V_C$ may be fixed in the memory 54, or, preferably, may be adjustable, for example by being regulated on the dashboard of the vehicle 20, as shown in FIG. 1.

Thus the driver 24 can set the degree of darkening to any desired value in order to observe the road scene SR in front of his vehicle 20 in the best possible conditions, the amount of light reaching his driver's eye 24 remaining constant and equal to a predetermined value, as assigned by the driver 24 to the memory 54.

According to a preferred embodiment of the invention, the transmission of the signals could be made to take place not in a continuous, analog way as described above, but rather in a digital way, that is to say in an alternating way, preferably in PWM (standing for the English expression "pulse width modulation") mode, at a predetermined frequency, according to the diagrams of FIG. 3.

According to this embodiment, the photosensitive sensor 31 sends an analog signal whose value is a function of the luminous intensity that it receives from the road scene SR in front of the vehicle 20. The sensor 31 is associated with a circuit that converts this analog signal into a PWM coded digital signal $S_L$.

As shown in FIG. 3A, this signal $S_L$ varies between a value of $S_{Lmin}$ for a duration (t1) and a value of $S_{LMAX}$ for a duration $t_2$, the sum of the durations $t_1$ and $t_2$ defining the period T of the alternating signal $S_L$.

It should be noted that the duty cycle β of the signal $S_L$ is determined by the ratio between the duration $t_2$ for which the signal is at a maximum and the duration T of the period, and thus varies from 0 to 100%:

$$\beta = \frac{t_2}{T}$$

The duty cycle β thus appears as a direct function of the luminous intensity received by the sensor 31

This signal $S_L$ is received by the circuit 33, which converts it into a control signal $S_C$ shown in FIG. 3B.

The signal $S_C$ varies between a maximum value $S_{CMAX}$ for the duration $t_1$ and a minimum value $S_{Cmin}$ for the duration $t_2$, with the same period $T=t_1+t_2$ as the signal $S_L$ and with a duty cycle α such that $$\alpha = \frac{t_1}{T} = 1 - \beta$$

To summarize, in response to the signal $S_L$ supplied by the photosensitive sensor 31, which is a function of the value of the brightness of the road scene SR in front of the vehicle 20, the circuit 33 generates an alternating signal $S_C$ in pulse width modulation (PWM) mode, at a predetermined frequency $$v = \frac{1}{T}$$

and with a predetermined duty cycle α, according to the diagram of FIG. 3B, showing the brightness of the road scene in front of the vehicle as measured by the sensor 31.

This signal $S_C$ is transmitted to the variable-transmission screen E by a wire link 37 or by means of the waves $O_T$, the signals $L_I$ and $V_C$ being taken into account if appropriate.

The coefficient of transmission of the variable-transmission screen E varies, in response to the signal $S_C$, between a value of $CT_{MAX}$ for the duration $t_1$ and a value ($CT_{min}$) for the duration $t_2$, with the same duty cycle α as the signal $S_C$ and the same frequency ν.

The value CTMAX is the value for which the glasses lenses 28 have their maximum transparency. In most cases, liquid crystal screens or microelectromechanical systems have this state in the absence of any electrical excitation, in other words in the rest state, and are opaque only under the effect of an electric field. In these cases, the value $CT_{MAX}$ corresponds to a minimum excitation of the liquid crystals or the microelectromechanical systems forming the glasses lenses 28.

In some cases, the rest state of a liquid crystal screen or of a microelectromechanical system may be that in which it has maximum opacity, becoming transparent only under the effect of an electric field. In this eventuality, the value $CT_{MAX}$ corresponds to a maximum excitation of the liquid crystals or of the microelectromechanical systems forming the glasses lenses 28.

The above explanations are applicable, mutatis mutandis, to the value $CT_{min}$ of the coefficient of transmission of the glasses lenses 28.

Thus the diagram of FIG. 3C shows the variation of the coefficient of transmission CT of the glasses lenses 28, rather than the variation of the excitation signal of these glasses lenses 28.

The driver 24 can therefore observe the road scene SR through the variable-transmission screen, regardless of whether this screen is the windshield 26, the screen E, or glasses 28, the coefficient of transmission of the screen E being adjusted in real time as a function of the brightness of the road scene SR: as the road scene SR becomes brighter, the variable-transmission screen E increasingly attenuates the light reaching the driver 24.

The automatic adjustment of the coefficient of transmission of the variable-transmission screen E is achieved by a sequence of states of maximum and minimum transparency of this screen E, at a frequency ν and with a duty cycle α. The frequency ν is chosen to be high enough to prevent any scintillation phenomenon for the driver 24 of the vehicle 20. The frequency ν will be, for example, greater than 100 Hz, to benefit fully from the phenomenon of persistence of vision.

Thus a method and a device for daytime motor vehicle driving assistance has indeed been devised, providing a vehicle driver 24 with:
  attenuation of the brightness of a strongly sunlit road scene SR, thus preventing the dazzling of the driver 24,
  a view of the road scene SR with attenuation progressively decreasing as a function of the reduction of the brightness of the road scene SR, to a point of maximum transparency when the brightness of the road scene SR is low,
  the variation of the attenuation taking place automatically and in real time, without any inconvenience caused to the driver 24 by the device, because the latter is integrated either into the windshield 26 of the vehicle 20 or into a movable screen of the sun visor type, or into a pair of glasses 28 whose coefficient of transmission is controlled by a wireless control system.

Clearly, the present invention is not limited to the embodiments which have been described; in fact, persons skilled in the art may make numerous modifications to the invention, all of which fall within its scope. Thus, for example, the invention is applicable to the passengers as well as to the driver 24, particularly if the variable-transmission screen E is formed by the windshield 26 of the vehicle 20. If the variable-transmission screen E is formed by glasses 28 for the driver 24, as described more particularly above, then the passenger can obviously also wear glasses with a variable coefficient of transmission like those of the driver 24. If the transmission of the control signal $S_C$ to the driver's glasses 28 takes place by wireless communication, the passengers' glasses will receive the same control signal and will react in the same way as the driver's glasses 28, without any adaptation.

Similarly, it is possible to provide two successive variable-transmission screens, for example the windshield 26 and a movable screen E of the sun visor type, to provide the upper part of the driver's 24 field of view (seen via the screen E and the windshield 26) with greater attenuation than the lower part (seen via the windshield 26 alone).

It is also possible to provide two successive variable-transmission screens, formed by the windshield 26 and the glasses 28 worn by the driver 24. With this arrangement, the driver 24 will benefit from the fixed attenuation provided by the windshield 26, supplemented by an adjustable attenuation that he can control on the dashboard, while the passengers will benefit from the fixed attenuation provided by the windshield 26 alone.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A method for assisting the daytime driving of a motor vehicle, including the steps of:
  placing at least one variable-transmission screen between a driver of a motor vehicle and a road scene (SR) in front of said vehicle;
  measuring, by means of at least one sensor, a brightness of said road scene (SR) in front of said vehicle;
  processing a brightness measurement signal ($S_L$) to convert it into a signal ($S_C$) for controlling a coefficient of transmission of said at least one variable-transmission screen,
  wherein the method includes the further step of transmitting said control signal ($S_C$) by remote control waves ($O_T$) to a receiver fitted to said at least one variable-transmission screen for modulating a coefficient of transmission (CT) of said at least one variable-transmission screen as a function of said brightness measured by said at least one sensor.

2. The method as claimed in claim 1, wherein said coefficient of transmission (CT) of said at least one variable-transmission screen is modulated as a function of said brightness measured by said at least one sensor, between a maximum value ($CT_{MAX}$) for a maximum transparency for a first duration ($t_1$) and a minimum value ($CT_{min}$) for a minimum transparency for a second duration ($t_2$).

3. The method as claimed in claim 2, wherein said first duration ($t_1$) with a maximum coefficient of transmission ($CT_{MAX}$) and said second duration ($t_2$) with a minimum coefficient of transmission ($CT_{min}$) follow one another according to a pulse width modulation (PWM) cycle.

4. The method as claimed in claim 3, wherein said coefficient of transmission of said at least one variable-transmission screen is a function of said measurement of said brightness of said road scene (SR) in front of said vehicle.

5. A device for assisting the daytime driving of a motor vehicle, including:
- a variable-transmission screen between a driver of a vehicle and a road scene (SR) in front of said vehicle;
- a sensor which measures a brightness of said road scene (SR) in front of said vehicle;
- a device for processing a brightness measurement signal ($S_L$) to convert it into a signal ($S_C$) for controlling a coefficient of transmission of said variable-transmission screen,
- wherein a control unit receives said control signal ($S_C$) and transmits it by remote control waves ($O_T$) to a receiver fitted to said variable-transmission screen in order to control said coefficient of transmission (CT) of said variable-transmission screen.

6. The device as claimed in claim 5, wherein said coefficient of transmission (CT) of said variable-transmission screen is modulated as a function of said brightness measured by said sensor, between a maximum value ($CT_{MAX}$) for a maximum transparency for a first duration ($t_1$) and a minimum value ($CT_{min}$) for a minimum transparency for a second duration ($t_2$).

7. The device as claimed in claim 6, wherein said coefficient of transmission (CT) of said variable-transmission screen is modulated according to a pulse width modulation (PWM) cycle.

8. The device as claimed in claim 7, wherein a duty cycle ($\alpha$) of said pulse width modulation (PWM) cycle is a function of said measurement of said brightness of said road scene (SR) in front of said vehicle.

9. The device as claimed in claim 4, wherein said variable-transmission screen between said driver of said vehicle and said road scene (SR) in front of said vehicle is formed by:
- a windshield of said vehicle;
- a screen (E) placed between said windshield of said vehicle and said driver of said vehicle; or
- glasses worn by said driver of said vehicle.

10. The device as claimed in claim 5, wherein said coefficient of transmission (CT) of said variable-transmission screen is controlled as a function of said measured brightness according to a wireless communication protocol.

11. The device as claimed in claim 5, wherein said coefficient of transmission (CT) of said variable-transmission screen is controlled by said control unit receiving said signals from said sensor for measuring said brightness of said road scene in front of said vehicle, and said signals from a sensor for measuring an amount of light transmitted by said variable-transmission screen.

12. The device as claimed in claim 6, wherein a duty cycle ($\alpha$) of a pulse width modulation (PWM) cycle is a function of said measurement of said brightness of said road scene in front of said vehicle.

13. The device as claimed in claim 5, wherein said variable-transmission screen is formed by a liquid crystal screen or by a microelectromechanical system.

14. The device as claimed in claim 5, wherein variable-transmission screen is associated with an independent electrical power supply.

15. A variable-transmission screen adapted to be placed between a driver of a motor vehicle and a road scene (SR) in front of said vehicle, wherein a coefficient of transmission (CT) of said variable-transmission screen is variable according to a pulse width modulation (PWM) mode between a maximum value ($CT_{MAX}$) and a minimum value ($CT_{min}$), said coefficient of transmission (CT) of said variable-transmission screen being controlled by a control unit according to a wireless communication protocol, by means of remote control waves (OT) transmitted by a transmitter of said control unit and received by a receiver.

16. The device as claimed in claim 6, wherein said variable-transmission screen between said driver of said vehicle and said road scene (SR) in front of said vehicle is formed by:
- a windshield of said vehicle;
- a screen (E) placed between said windshield of said vehicle and said driver of said vehicle; or
- glasses worn by said driver of said vehicle.

17. The device as claimed in claim 6, wherein said coefficient of transmission (CT) of said variable-transmission screen is controlled as a function of said measured brightness according to a wireless communication protocol.

18. The device as claimed in claim 6, wherein said coefficient of transmission (CT) of said variable-transmission screen is controlled as a function of said measured brightness according to a wireless communication protocol.

19. The device as claimed in claim 6, wherein said coefficient of transmission (CT) of said variable-transmission screen is controlled by said control unit receiving said signals from said sensor for measuring said brightness of said road scene in front of said vehicle, and said signals from a sensor for measuring an amount of light transmitted by said variable-transmission screen.

20. The device as claimed in claim 6, wherein a duty cycle ($\alpha$) of a pulse width modulation (PWM) cycle is a function of said measurement of said brightness of said road scene in front of said vehicle.

* * * * *